United States Patent [19]
Takeuchi et al.

[11] Patent Number: 5,184,073
[45] Date of Patent: Feb. 2, 1993

[54] METHOD FOR CORRECTING PHASE ERRORS IN A NUCLEAR MAGNETIC RESONANCE SIGNAL AND DEVICE FOR REALIZING SAME

[75] Inventors: Hiroyuki Takeuchi, Kashiwa; Tatsuo Nozokido, Sendai; Chikako Nakamura, Matsudo, all of Japan

[73] Assignees: Hitachi Medical Corporation; Hitachi, Ltd., both of Tokyo, Japan

[21] Appl. No.: 682,472

[22] Filed: Apr. 9, 1991

[30] Foreign Application Priority Data

Apr. 9, 1990 [JP] Japan ................................ 2-092233

[51] Int. Cl.⁵ .............................................. G01R 33/20
[52] U.S. Cl. ..................................... 324/309; 324/307
[58] Field of Search ............... 324/300, 307, 309, 318, 324/322

[56] References Cited

U.S. PATENT DOCUMENTS

| | | | |
|---|---|---|---|
| 4,706,027 | 11/1987 | Hughes | 324/309 |
| 4,724,388 | 2/1988 | Sano et al. | 324/309 |
| 4,870,361 | 9/1989 | In Den Kleef | 324/309 |
| 4,876,507 | 10/1989 | Van Voals | 324/307 |

Primary Examiner—Michael J. Tokar
Attorney, Agent, or Firm—Antonelli, Terry, Stout & Kraus

[57] ABSTRACT

A method for correcting phase errors in a nuclear magnetic resonance signal is disclosed, by which central frequencies of NMR signals are measured directly before and directly after or in addition in a course of a normal measurement for obtaining an NMR signal for imaging and an amount of phase error is obtained for each of the NMR signals for imaging by using a difference between the central frequencies and a measurement time for each of the NMR signals for imaging.

14 Claims, 5 Drawing Sheets

F I G. 5
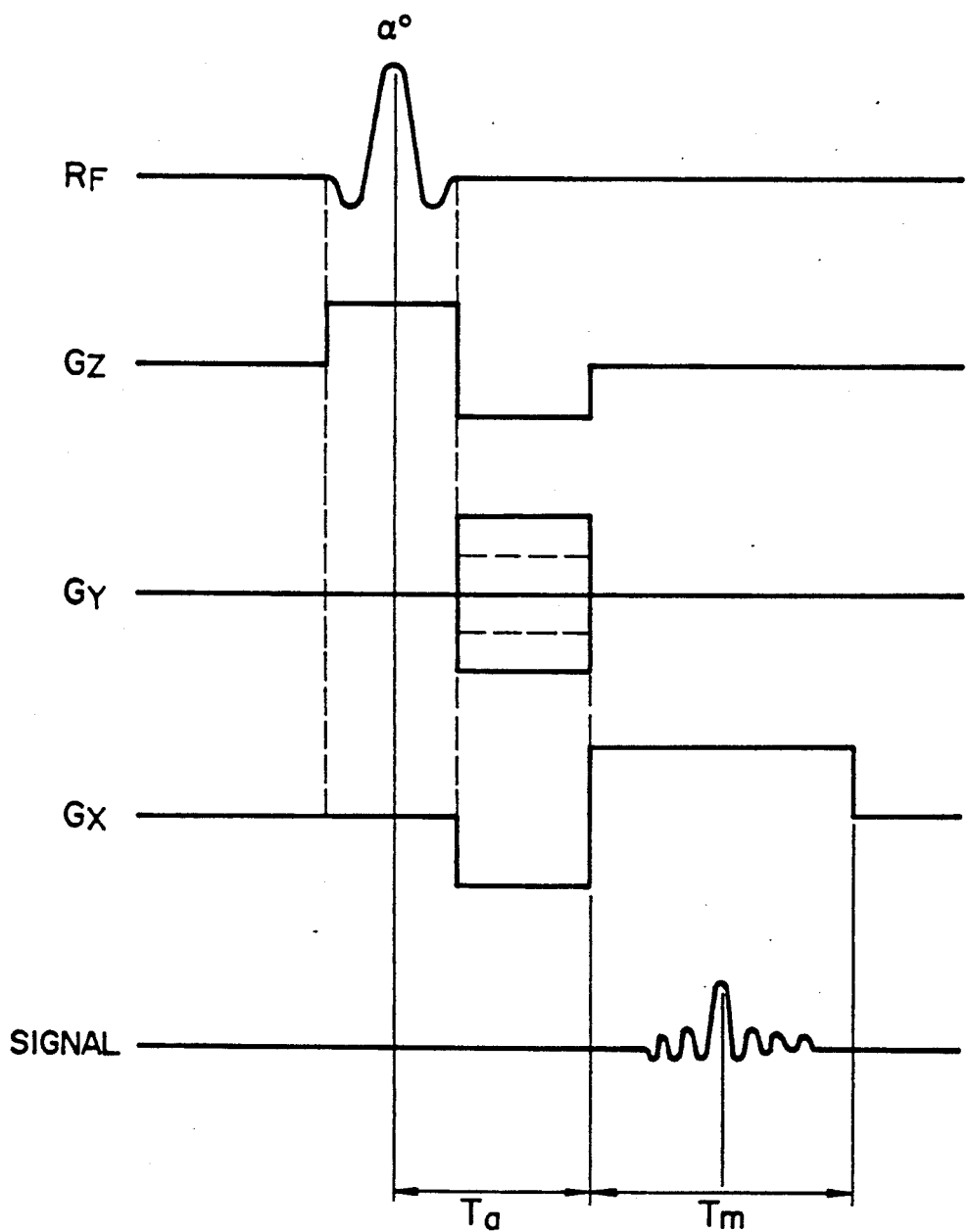

METHOD FOR CORRECTING PHASE ERRORS IN A NUCLEAR MAGNETIC RESONANCE SIGNAL AND DEVICE FOR REALIZING SAME

BACKGROUND OF THE INVENTION

The present invention relates to a method for obtaining a tomographic image of a body to be examined, using nuclear magnetic resonance (hereinbelow called NMR) phenomena and in particular to a method for correcting deviations in the phase of NMR signals produced by variations in the static magnetic field, capable of improving the image quality, and a device for realizing same.

For the method for generating the static magnetic field in an MRI device there are three systems, i.e. superconductive magnet system, resistive magnet system and permanent magnet system. Fluctuations in the static magnetic field in a device using the superconductivity are in an order of 0.1 ppm/h and thus a static magnetic field extremely stable can be obtained. In the resistive magnetic system an extremely stable current source is required. However, the static magnetic field obtained thereby has fluctuations of an order of several ppm due to short time drift in a driving circuit therefor or mixing of hum as well as temperature fluctuations in cooling water for a coil. In the permanent magnet system the material itself has a temperature coefficient having an order of magnitude of 200 to 2000 ppm/C°, although it varies, depending on the material and therefor small temperature variations can be a factor of fluctuations in the static magnetic field.

The fundamental principle of the imaging method using the NMR phenomena is that the resonance frequency thereof is proportional to the intensity of the magnetic field. Consequently, when the intensity of the static magnetic field severing as the base for the method is varied, the frequency of the obtained signal is also varied, which manifests itself in the form of deviations in the position of the image and produces ghost and blur in the image, causing lowering the image quality.

Therefore, in an MRI device by the prior art resistive magnet system, magnetic field locking means is used often for correcting the intensity of the static magnetic field by measuring directly or indirectly the intensity of the static magnetic field before or during the measurement to feed it back. However, in the permanent magnet system, since it has neither coil nor driving device producing the static magnetic field, it causes elevation in the cost and prolongation of measurement time to dispose the magnetic field locking means therefor.

As a prior art technique for dealing with variations in the static magnetic field in the MRI device using a permanent magnet, there is known that disclosed in JP-A-61-280551. However, by this correcting method, since correction is effected in unit of pixel after Fourier transformation, no attention is paid to deviations within one pixel. Since even deviations within one pixel can cause fairly remarkable blur from the point of view of the image quality attention should be paid thereto.

SUMMARY OF THE INVENTION

The present invention has been done in view of the situations described above and the object thereof is to remove almost completely blur in pixels due to variations in the static magnetic field in the permanent magnet system to obtain an image of high quality.

In order to achieve the above object, according to the present invention, the central frequency of the NMR signal is measured directly before and directly after scanning and the phase of the NMR signal for imaging is corrected on the basis of variations therein.

According to the present invention since the blur due to deviations in the central frequency during the measurement can be removed almost completely, it is possible to obtain a clear image having no lowering in the spatial resolving power.

BRIEF DESCRIPTION OF THE DRAWINGS

FIG. 5 shows a typical pulse sequence by the gradient echo method;

DESCRIPTION OF THE PREFERRED EMBODIMENTS

Figure 1:
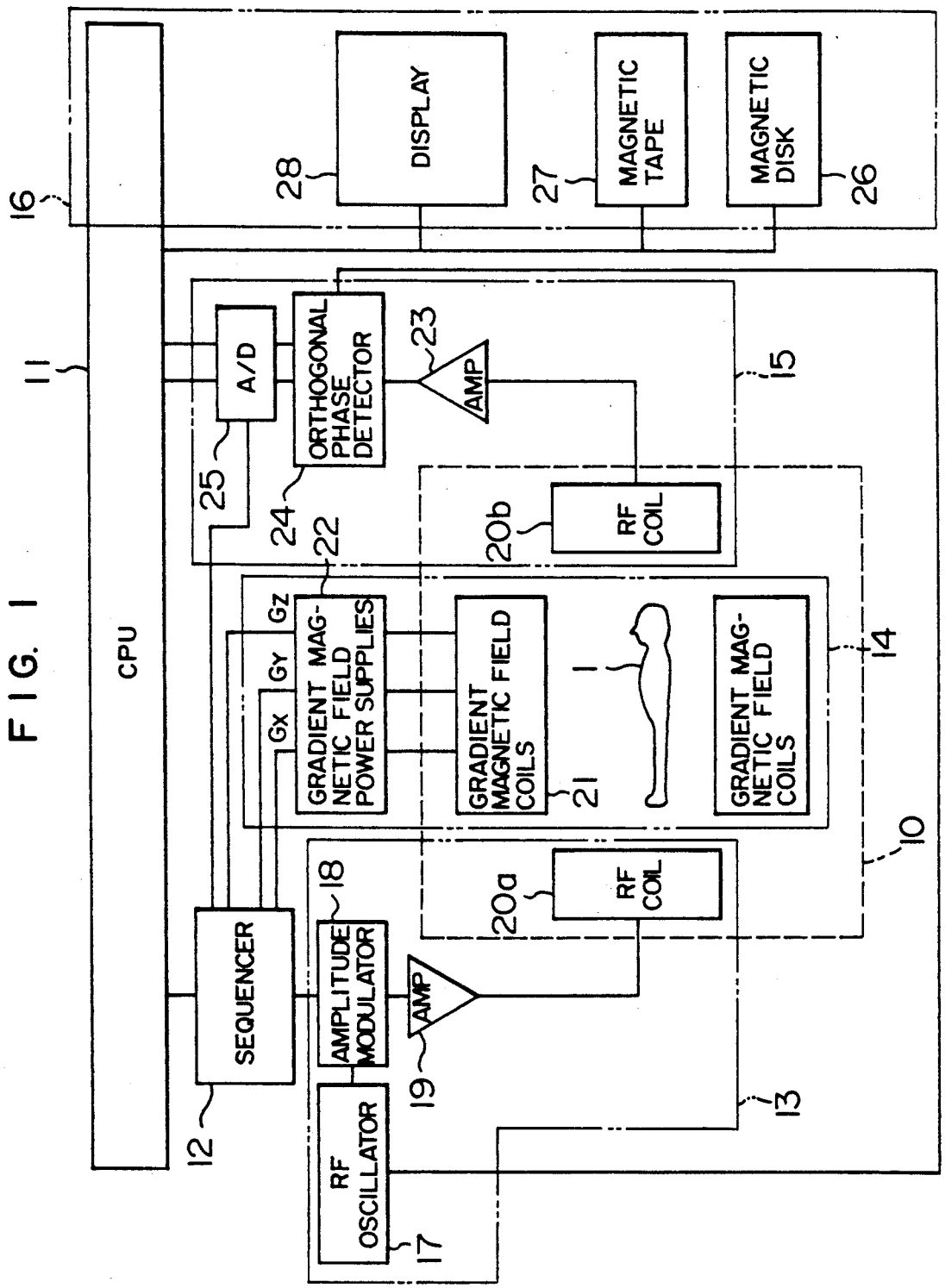
FIG. 1 is a block diagram indicating the construction of an MRI device, to which the present invention is applied.

Hereinbelow an embodiment of the present invention will be explained, referring to the drawings. FIG. 1 is a block diagram indicating the construction of an MRI device according to the present invention. This device is used for obtaining a tomographic image of a body to be examined 1, using the NMR phenomena, and consists of a static magnetic field generating magnet 10, a central processing unit (hereinbelow called CPU) 11, a sequencer 12, a transmitting system 13, a gradient magnetic field generating system 14, a receiving system 15 and a signal processing system 16. The static magnetic field generating magnet 10 described above is a permanent magnet, which generates an intense and uniform static magnetic field around the body to be examined 1 in a direction parallel or perpendicular to the body axis. The sequencer 12 described above is operated under the control of the CPU 11 and transmits various sorts of instructions necessary for collecting data on the tomographic image of the body to be examined 1 to the transmitting system 13, the gradient magnetic field generating system 14 and the receiving system 15. The transmitting system 13 described above consists of an RF oscillator 17, an amplitude modulator 18, an RF amplifier 19 and an RF coil 20a on the transmitter side. An RF pulse outputted by the RF oscillator 17, is amplitude-modulated by the amplitude modulator 18 according to an instruction from the sequences 12 the body to be examined 1 is irradiated with electromagnetic wave by feeding the RF coil 20a located closely to the body to be examined 1 with the RF pulse thus amplitude-modulated after having been amplified by the RF amplifier 19. The gradient magnetic field generating system 14 consists of gradient magnetic field coils 21 varying the intensity of the magnetic field along three axis of X, Y and Z, respectively, and gradient magnetic field power supplies driving the respective coils so that gradient magnetic fields $G_x$, $G_y$ and $G_z$ in the three axial directions of X, Y and Z are applied to the body to be examined 1 by driving the gradient magnetic field power supplies 22 for the respective coils according to instructions from the sequences 12. It is possible to set a slice face with respect to the body to be examined 1, depending on the manner how these gradient magnetic fields are applied. The receiving system 15 described above consists of an RF coil 20b on the receiver side, an amplifier 23, an orthogonal phase detector 24 and an A/D converter 25. Electromagnetic wave (NMR signal), response by the body to be examined 1 to the electromagnetic wave emitted by the RF coil 20a on the transmitter side, is detected by the RF coil 20b located closely to the body to be examined 1 and inputted in the A/D converter 25 through the amplifier 23 and the orthogonal phase detector 24 to be converted into a digital quantity. It is further converted into two series of collected data having phases of 0° and 90° by the orthogonal phase detector 24 with a timing according to an instruction from the sequencer 12, which are transmitted to the signal processing system 16. This signal processing system 16 consists of the CPU 11, a recording device such as a magnetic disk 26, a magnetic tape 27, etc. and a display such as a CRT, etc. and it is so constructed that the CPU 11 executes processing such as Fourier transformation, calculation of correction coefficients, image reconstruction, etc. to display a signal intensity distribution for an arbitrary cross-section or a distribution obtained by effecting suitable operations on a plurality of signals on the display 28 while transforming them into an image. The RF coils 20a and 20b on the transmitter and the receiver side as well as the gradient magnetic field coils 21 are located within the space of the magnetic field produced by the static magnetic field generating magnet 10 disposed in the space around the body to be examined 1.

Figure 2:
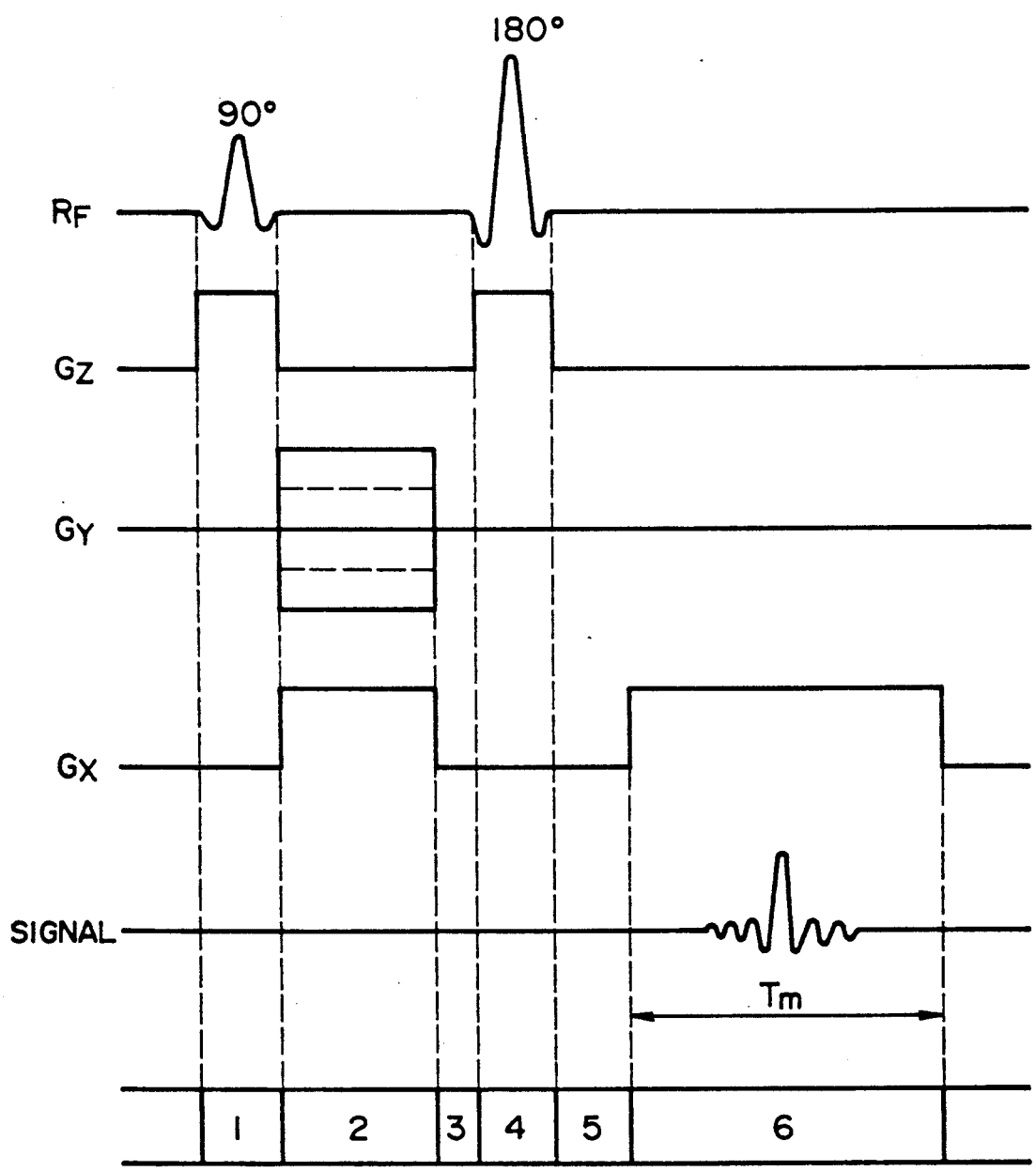
FIG. 2 shows a typical pulse sequence by the spin echo method.

FIG. 2 represents schematically the time sequence by a typical spin echo (hereinbelow abbreviated to SE) method. In FIG. 2, RF indicates the timing of irradiation with an RF signal (RF pulse) and an envelope for the selective excitation. $G_z$ indicates the timing of the gradient magnetic field application in the slice direction. $G_y$ indicates the timing of the gradient magnetic field (phase encoding pulse) application in the phase encoding direction and the fact that the measurement is effected while varying the amplitude thereof $G_x$ indicates the timing of the frequency encoding gradient magnetic field (frequency encoding pulse) application and Signal indicates a measured NMR signal. The bottom row shows that the whole time sequence is divided into 6 sections. The X, Y and Z axes are cartesian coordinate axes, which are perpendicular to each other. In FIG. 2, in Section 1, the body to be examined is irradiated with the 90° selective excitation pulse and the gradient magnetic field $G_z$ in the slice direction is applied thereto. In Section 2, the phase encoding pulse $G_y$ is applied thereto to give nuclear spin rotation depending on the position in the Y direction. Further, in Section 2, the frequency encoding pulse $G_x$ is applied thereto. This dephases previously the nuclear spin (rotating inversely the phase) so that the time origin is at the center of Section 6, when the NMR signal is measured in Section 6. In Section 3, no signal is emitted. In Section 4, the body to be examined is irradiated with the 180° selective excitation pulse and at the same time the gradient magnetic field $G_z$ in the slice direction is applied thereto. In Section 5, no signal is emitted. In Section 6, the frequency encoding pulse $G_x$ is applied thereto and the NMR signal is measured.

In order to obtain a usual two-dimensional image, the phase encoding pulse $G_y$ is varied so as to have e.g. 256 different values and the measurement is effected by repeating the sequence of Sections 1 to 6 256 times. The direction, in which the phase encoding pulse $G_y$ is varied, is called view direction.

In order to perform the NMR imaging, the body to be examined 1 is irradiated with an RF pulse in the state where the gradient magnetic fields are added to the static magnetic field, as described previously, and the image is reconstructed by executing correction operations described later after having applied the gradient magnetic fields to measure the NMR signal, in order to encode the NMR signal coming from the examined region in the body to be examined 1 as spatial information.

Now, in the case where the permanent magnet system is used for the static magnetic field magnet 10, as described previously, the intensity of the magnetic field is varied, depending on temperature variations of the magnet. Since the total weight of iron material used for the magnet and the magnetic circuit is as great as 5 to 15 tons, the thermal inertia is extremely great. By the permanent magnet system, since a thermal isolation structure and a temperature keeping control are used usually, in the case where the ambient temperature is varied by several °C., the temperature of the magnet is varied by an order of 0.1° C. with a long time constant. When a temperature variation of 0.1° C. takes place, the central frequency of the NMR signal is shifted by several kHz. Since the measurement time of the NMR has an order of several to several tens of minutes, the temperature variation during the measurement may be considered to be almost linear. Therefore, according to the present invention, the central frequencies f (denoted by $f_1$ and $f_2$) are measured directly before and directly after a series of sequence indicated in FIG. 2 described above by a pulse sequence, by which neither phase encoding pulse $G_y$ nor frequency encoding pulse $G_x$ is applied in FIG. 2 and measured data are corrected on the basis of the shift between these frequences. It is matter of course that, in the case where the temperature variation is not linear, the central frequency may be measured necessary times in the course of the measurement.

Next, the principle of the correcting operation by the CPU 11 will be explained. Now, in the case where the static magnetic field $H_0$ is varied linearly due to temperature variations, the central frequency f of the obtained signal is varied also linearly according to the Harmor's formula ($f = \frac{1}{2} \cdot \gamma \cdot H$, where $\gamma$ represents the gyromagnetic ratio and H the intensity of the magnetic field) and can be represented as indicated e.g. in FIG. 3. When the central frequency f of the obtained signal is varied in time (with increasing view number) as described above, phases of the obtained signal are different at different sampling points. For example, in the measurement by the SE method indicated in FIG. 2, phase variations as indicated in FIG. 4 are produced so that errors are zero at the center of a measurement period $T_m$ owing to the 180° pulse and that errors are produced before and after it. The amount of this phase error is given by Eq. (1):

$$\phi(x,y) = 2\pi \cdot (f_2 - f_1) \cdot \frac{T_m}{2} \cdot \frac{y}{Y} \cdot \left( \frac{2x}{X} - 1 \right) [\text{rad}] \quad (1)$$

where
- $f_1$ ... central frequency directly before measurement
- $f_2$ ... central frequency directly after measurement
- $T_m$ ... duration of measurement for one view,
- x ... sample number within one view (0–127, 255, 511, etc.),
- X ... number of samples in one view (128, 256, 512, etc.),
- y ... view number within one measurement (0–127, 255, 511, etc.), and
- Y ... number of views in one measurement (128, 256, 512, etc.)

Figure 3:
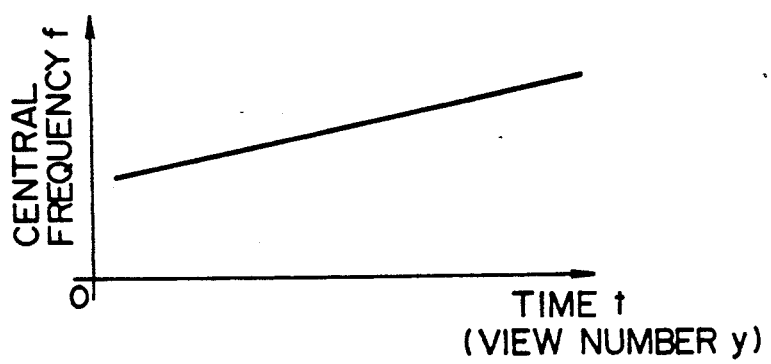
FIG. 3 is a graph representing variations in the central frequency of the NMR signal due to variations in the static magnetic field during a signal measurement.
Figure 4:
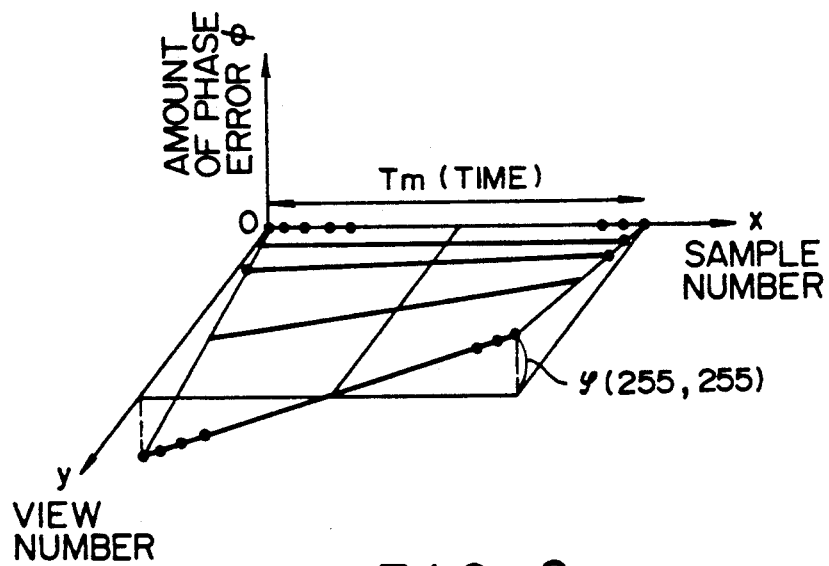
FIG. 4 is a scheme representing variations in the phase due to variations in the central frequency by the spin echo method.

In Eq. (1), $$(f_2 - f_1)\frac{y}{Y}$$

in the right member corresponds to the central frequency obtained by the linear approximation, using the graph indicated in FIG. 3.

The obtained signal $S_1(x,y)$ includes this amount of error and is given by Eq. (2);

$$S_1(x,y) = S(x,y) \cdot \exp\{j\phi(x,y)\} \quad (2)$$

where
- $S(x,y)$ ... correct measured signal in the case where the frequency is not varied, and
- j ....... imaginary unit The correct measured signal obtained by using Eq. (2) is given by Eq. (3);

$$S(x,y) = S_1(x,y) \cdot \exp\{-j\phi(x,y)\} \quad (3)$$

Consequently, by calculating the amount of phase error for each of measured data sets, using Eq. (1), and effecting the correction, using Eq. (3), it is possible to obtain correct measured data $S(x,y)$ including no frequency variations.

Figure 6:
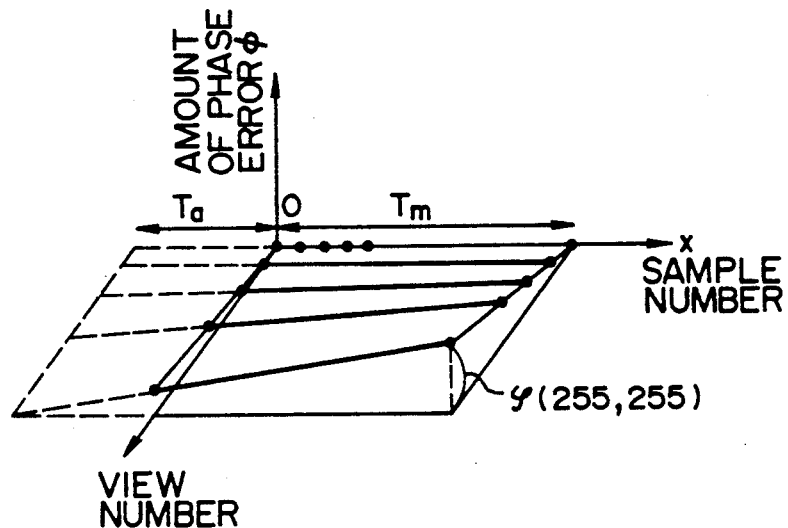
FIG. 6 is a scheme representing variations in the phase due to variations in the central frequency by the gradient echo method.

As a method for MRI measurement apart from the SE method described above, there is known a method called gradient echo method (hereinbelow abbreviated to GRE method), by which imaging is effected by using the pulse sequence indicated in FIG. 5. In this case, since there is no 180° pulse, the phase error varies linearly in time during the measurement, as indicated in FIG. 6 and it is given by Eq. (4);

$$\phi(x,y) = 2\pi(f_2 - f_1)\frac{y}{Y}\left(T_a + \frac{x}{X}T_m\right)[\text{rad}] \quad (4)$$

where $T_a$ ... time measured from the center of the 90° pulse to the starting point (x=0) of the measurement.

The central frequences $f_1$ and $f_2$ directly before and directly after the measurement are measured similarly to the SE method. By the GRE method the correcting operation is effected by using these Eqs. (4) and (3).

Figure 7:
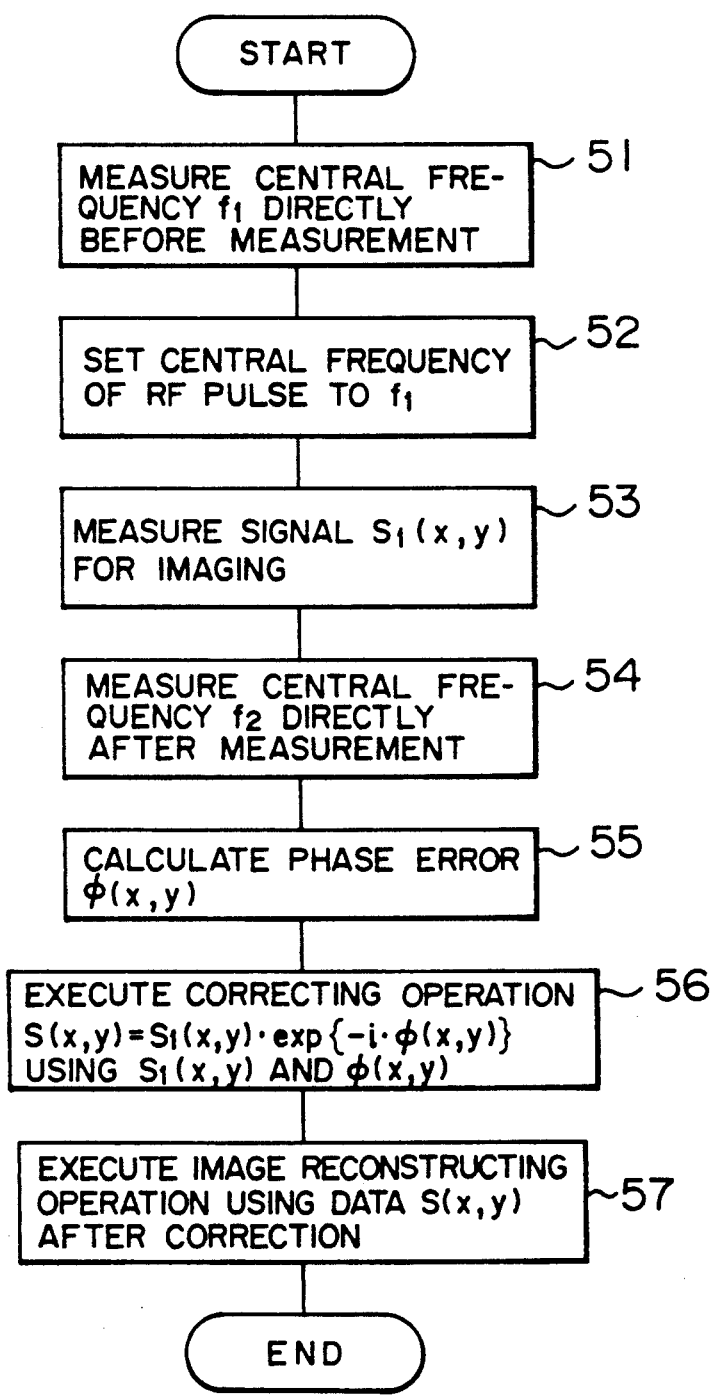
FIG. 7 is a flow chart indicating a signal measurement and an operation for correcting signals according to the present invention.

Next, the procedure of the measurement and the correcting operation will be explained, referring to FIG. 7. This procedure is executed under the control of the CPU 11. At first, in Step 51, the central frequency $f_1$ of the nuclear magnetic resonance in the body to be examined is measured within several seconds directly before the measurement. At this time, at least neither the phase encoding pulse $G_y$ nor the frequency encoding pulse $G_x$ are applied.

The sampled NMR signal is A/D-converted and Fourier-transformed to obtain the frequency spectrum. Thus the central frequency $f_1$ giving the peak of the spectrum is obtained.

In Step 52, the central frequency of the RF pulse when a normal measurement is effected is set at $f_1$.

In Step 53, a normal signal $S_1(x,y)$ for imaging is measured.

In Step 54, the central frequency $f_2$ of the NMR signal is measured within several seconds directly after the measurement according to a procedure similar to that used in Step 51.

In Step 56, the amount of phase error $\phi(x,y)$ at each of the measurement points is calculated by using Eq (1) in the case of the SE method and Eq. (4) in the case of the GRE method. Next the correcting operation is executed by using Eq. (3) to obtain the measured data $S(x,y)$, in which the frequency variations are corrected. In Step 57, a usual image reconstructing operation such as a two-dimensional Fourier transformation, etc. is executed on the basis of these data to obtain an image having no blur. The processing in Step 52 is not always necessary but the discrepancy between the central frequency directly before the measurement and the central frequency of the RF pulse may be taken into account in the formula for obtaining the amount of phase error.

Although, in the above explanation, a practical method for correcting the measured data by using the central frequences directly before and directly after the measurement has been explained, the correction can be easily realized by applying the method according to the present invention, even in the case where the variations in the intensity of the magnetic field described above are not linear, but it varies slowly. That is, the central frequency is measured N times between a point of time directly before the measurement and a point of time directly after the measurement and the amount of phase error $\phi(x,y)$ is obtained by using the corresponding central frequencies $(f_1, \ldots, f_i, \ldots, f_N)$ and transforming Eq. (1) or (4). It is practical to use a smallest number for N, with which it is possible to reproduce the phase variation. The equation representing the amount of phase error by the SE method in this case is given by transforming Eq. (1) as follows:

$$\phi(x,y) = 2\pi \cdot \frac{T_m}{2} \left\{ (f_{i+1} - f_i) \cdot \frac{y - y_i}{y_{i+1} - y_i} + f_i - f_1 \right\} \times \left( \frac{2x}{X} - 1 \right)[\text{rad}] \quad (5)$$

where
- i ... measurement number for the central frequency (i=1, ..., N),
- $f_i$ ... i-th central frequency, and
- $Y_i$ ... view number directly after $f_i$ has been measured (e.g. 0, 63, 127, 191, 255)

The operation comprised between parentheses {} in the right member of Eq (5) corresponds to obtaining the central frequency by the linear approximation in the graph indicated in FIG. 3. For an arbitrary y in Eq. (5)

the amount of phase error is obtained by using closest $y_i$ and $y_{i+1}$.

The correction can be effected by using $\phi(x,y)$ expressed by this equation (5) in the procedure described previously referring to FIG. 7, even if the central frequency in the SE method varies slowly.

Similarly, by the GRE method, Eq. (6) obtained by transforming Eq. (4);

$$\phi(x,y) = \qquad (6)$$
$$2\pi \left\{ (f_{i+1} - f_i) \cdot \frac{y - y_i}{y_{i+1} - y_i} + f_i - f_1 \right\} \left( Ta + \frac{x}{X} T_m \right) [\text{rad}]$$

may be used.

Although, in the above embodiments of the present invention, the amount of phase error for the NMR signal for imaging has been obtained by the linear approximation on the basis of the obtained central frequency, an approximation method of higher order may be used instead thereof.

We claim:

1. A method for correcting phase errors in a nuclear magnetic resonance signal comprising the steps of:
   (a) measuring a first NMR signal in a pulse sequence, where at least neither phase encoding pulse nor frequency encoding pulse is applied to a body to be examined, directly before a normal measurement for obtaining an NMR signal for imaging is effected;
   (b) obtaining a frequency spectrum for said first NMR signal and a first central frequency giving a peak of said frequency spectrum;
   (c) effecting said normal measurement according to a predetermined pulse sequence;
   (d) measuring a second NMR signal in a pulse sequence, where at least neither said phase encoding pulse nor said frequency encoding pulse is applied thereto, directly after said normal measurement;
   (e) obtaining a frequency spectrum for said second NMR signal and a second central frequency giving a peak of said frequency spectrum;
   (f) obtaining an amount of phase error for each of said NMR signals for imaging by using a difference between said first central frequency and said second central frequency and a measurement time for each of said NMR signals for imaging;
   (g) correcting said phase error for each of said NMR signals for imaging; and
   (h) reconstructing an image by using a signal corrected.

2. A method for correcting phase errors in a nuclear magnetic resonance signal according to claim 1, wherein said step of effecting said normal measurement includes a step of setting a central frequency of an RF pulse at said first central frequency.

3. A method for correcting phase errors in a nuclear magnetic resonance signal according to claim 1, wherein said step of obtaining an amount of phase error includes a step of obtaining an amount of phase error for each of said NMR signals for imaging by a linear approximation; and
   wherein said step of correcting said phase error includes a step of executing an operation for setting said phase error to zero for each of said NMR signals for imaging.

4. A method for correcting phase errors in a nuclear magnetic resonance signal comprising the steps of:
   (a) measuring a first NMR signal in a pulse sequence, where at least neither phase encoding pulse nor frequency encoding pulse is applied to a body to be examined, directly before a normal measurement for obtaining an NMR signal for imaging is effected;
   (b) obtaining a frequency spectrum for said first NMR signal and a first central frequency giving a peak of said frequency spectrum;
   (c) measuring second to (n−1)-th NMR signals, where N is an integer, in a pulse sequence, where at least neither phase encoding pulse nor frequency encoding pulse is applied thereto, once or at a plurality of different times in a course, when said normal measurement is effected according to a predetermined pulse sequence;
   (d) measuring an N-th NMR signal in a pulse sequence, where at least neither said phase encoding pulse nor said frequency encoding pulse is applied thereto, directly after said normal measurement;
   (e) obtaining frequency spectrums for said second to N-th NMR signals and second to N-th central frequencies giving respective peaks of said frequency spectrums;
   (f) obtaining an amount of phase error for each of said NMR signals for imaging by using a difference between said central frequencies and a measurement time for each of said NMR signals for imaging at closest points of time before and after each of said NMR signals for imaging obtained by said normal measurement;
   (g) correcting said phase error for each of said NMR signals for imaging; and
   (h) reconstructing an image by using a signal corrected.

5. A method for correcting phase errors in a nuclear magnetic resonance signal according to claim 4, wherein said step of effecting said normal measurement includes a step of setting a central frequency of an RF pulse to said first central frequency.

6. A method for correcting phase errors in a nuclear magnetic resonance signal according to claim 4,
   wherein said step of obtaining an amount of phase error includes a step of obtaining an amount of phase error for each of said NMR signals for imaging by a linear approximation; and
   wherein said step of correcting said phase error includes a step of executing an operation for setting said phase error to zero for each of said NMR signals for imaging.

7. A method for correcting phase errors in a nuclear magnetic resonance signal comprising the steps of:
   (a) measuring NMR signal in a pulse sequence, where at least neither phase encoding pulse nor frequency encoding pulse is applied to a body to be examined, at least directly before and directly after a normal measurement for obtaining an NMR signal for imaging is effected, to obtain central frequencies thereof;
   (b) obtaining an amount of phase error for each of said NMR signals for imaging by using a variation between said central frequencies obtained and a measurement time for each of said NMR signals for imaging to correct said phase error therefor; and
   (c) constructing an image by using a signal corrected.

8. A device for correcting phase errors in a nuclear magnetic resonance signal comprising:
   (1) static magnetic field generating means using a permanent magnet;
   (2) means for generating gradient magnetic field in directions of three axes of a three-dimensional coordinate system;
   (3) means for measuring a first NMR signal in a pulse sequence, where at least neither phase encoding pulse nor frequency encoding pulse is applied to a body to be examined, directly before a normal measurement for obtaining an NMR signal for imaging is effected;
   (4) means for obtaining a frequency spectrum for said first NMR signal and a first central frequency giving a peak of said frequency spectrum;
   (5) control means for effecting said normal measurement according to a predetermined pulse sequence;
   (6) means for measuring a second NMR signal in a pulse sequence, where at least neither said phase encoding pulse nor said frequency encoding pulse is applied thereto, directly after said normal measurement;
   (7) means for obtaining a frequency spectrum for said second NMR signal and a second central frequency giving a peak of said frequency spectrum;
   (8) means for obtaining an amount of phase error for each of said NMR signals for imaging by using a difference between said first central frequency and said second central frequency and a measurement time for each of said NMR signals for imaging;
   (9) means for correcting said phase error for each of said NMR signals for imaging; and
   (10) means for reconstructing an image by using said NMR signals corrected.

9. A device for correcting phase errors in a nuclear magnetic resonance signal according to claim 8, wherein said control means for effecting said normal measurement includes means for setting a central frequency of an RF pulse to said first central frequency.

10. A device for correcting phase errors in a nuclear magnetic resonance signal according to claim 8,
   wherein said means for obtaining an amount of phase error includes means for obtaining an amount of phase error for each of said NMR signals for imaging by a linear approximation; and
   wherein said means for correcting said phase error includes means for executing an operation for setting said phase error to zero for each of said NMR signals for imaging.

11. A device for correcting phase errors in a nuclear magnetic resonance signal comprising:
   (1) static magnetic field generating means using a permanent magnet;
   (2) means for generating gradient magnetic fields in directions of three axes of a three-dimensional coordinate system;
   (3) means for measuring a first NMR signal in a pulse sequence, where at least neither phase encoding pulse nor frequency encoding pulse is applied to a body to be examined, directly before a normal measurement for obtaining an NMR signal for imaging is effected;
   (4) means for obtaining a frequency spectrum for said first NMR signal and a first central frequency giving a peak of said frequency spectrum;
   (5) means for measuring second to (N−1)-th NMR signals, where N is an integer, in a pulse sequence, where at least neither phase encoding pulse nor frequency encoding pulse is applied thereto, once or at a plurality of different times in a course, when said normal measurement is effected according to a predetermined pulse sequence;
   (6) means for measuring an N-th NMR signal in a pulse sequence, where at least neither said phase encoding pulse nor said frequency encoding pulse is applied thereto, directly after said normal measurement;
   (7) means for obtaining frequency spectrums for said second to N-th NMR signals and second to N-th central frequencies giving respective peaks of said frequency spectrums;
   (8) means for obtaining an amount of phase error for each of said NMR signals for imaging by using a difference between said central frequencies and a measurement time for each of said NMR signals for imaging at closest points of time before and after each of said NMR signals for imaging obtained by said normal measurement;
   (9) means for correcting said phase error for each of said NMR signals for imaging; and
   (10) means for reconstructing an image by using said NMR signals corrected.

12. A device for correcting phase errors in a nuclear magnetic resonance signal according to claim 11, wherein said means for effecting said normal measurement includes means for setting a central frequency of an RF pulse to said first central frequency.

13. A device for correcting phase errors in a nuclear magnetic resonance signal according to claim 11,
   wherein said means for obtaining an amount of phase error includes means for obtaining an amount of phase error for each of said NMR signals for imaging by a linear approximation; and
   wherein said means for correcting said phase error includes means for executing an operation for setting said phase error to zero for each of said NMR signals for imaging.

14. A device for correcting phase errors in a nuclear magnetic resonance signal comprising:
   (1) means for measuring NMR signal in a pulse sequence, where at least neither phase encoding pulse nor frequency encoding pulse is applied to a body to be examined, at least directly before and directly after a normal measurement for obtaining an NMR signal for imaging is effected, to obtain central frequencies thereof;
   (2) means for obtaining an amount of phase error for each of said NMR signals for imaging by using a variation between said central frequencies obtained and a measurement time for each of said NMR signals for imaging to correct said phase error therefor; and
   (3) means for reconstructing an image by using said NMR signals corrected.

* * * * *